United States Patent [19]
Allison

[11] 3,883,948
[45] May 20, 1975

[54] SEMICONDUCTOR STRUCTURE AND METHOD

[75] Inventor: David F. Allison, Los Altos, Calif.

[73] Assignee: Signetics Corporation, Sunnyvale, Calif.

[22] Filed: Jan. 2, 1974

[21] Appl. No.: 429,933

[52] U.S. Cl. ...................... 29/577; 29/580; 357/50; 357/60

[51] Int. Cl. ............................................ B01j 17/00

[58] Field of Search ....... 29/577, 578, 580, 576 IW; 148/175

[56] References Cited

UNITED STATES PATENTS

| | | | |
|---|---|---|---|
| 3,355,636 | 11/1967 | Becke | 29/580 |
| 3,386,865 | 6/1968 | Doo | 148/175 |
| 3,416,224 | 12/1968 | Armstrong | 29/580 |
| 3,659,160 | 4/1972 | Sloan | 148/175 |
| 3,689,992 | 9/1972 | Schutze | 29/577 |
| 3,780,426 | 12/1973 | Ono | 29/580 |

*Primary Examiner*—Roy Lake
*Assistant Examiner*—Tupman
*Attorney, Agent, or Firm*—Flehr, Hohbach, Test, Albritton & Herbert

[57] ABSTRACT

Semiconductor structure formed from a semiconductor body having an impurity of one conductivity type therein and having a major surface lying in a <100> plane. Moats are provided which extend through the major surface and have spaced side walls lying in a plane different from the <100 > plane and at said surface define spaced islands. Layers of protective material are formed on the side walls of the moats. Regions of said impurity of one conductivity type and of greater concentration than that in the body extend downwardly into the body from the protective layers. An insulating material fills the moats and devices are formed in the islands. An insulating layer is formed on said surface and lead means is provided on the insulating layer and extends through the insulating layer to make contact to the devices and extends over the material in said moats to interconnect the devices in the spaced islands. It is desirable that the moats have a generally rectangular configuration with inner and outer perimeters and inner and outer corners. The outer corners are defined by diagonal, generally planar wall portions which lie in either the <110> plane or the <111> plane. If desired, the bottom of the moats can extend downwardly until the side walls form a Vee in cross-section.

7 Claims, 14 Drawing Figures

SEMICONDUCTOR STRUCTURE AND METHOD

BACKGROUND OF THE INVENTION

In copending application Ser. No. 169,294, filed Aug. 5, 1971, now U.S. Pat. No. 3,796,612 there is disclosed a semiconductor structure and method in which moats have been formed and below which regions of higher concentration extend. In connection with the formation of such moats, a problem has arisen in which it appears it is difficult to provide sufficiently thick layers of protective material on the outside corners to act as a mask against the impurity which is being introduced into the semiconductor body to form the regions of higher concentration. This can result in the P+ region at the bottom of the moat shorting out to the P type region at the top of the moat. There is, therefore, a need for a new and improved semiconductor structure and method which overcomes this problem.

SUMMARY OF THE INVENTION AND OBJECTS

The semiconductor structure consists of a semiconductor body having an impurity of one conductivity type therein and having a major surface lying in the <100> plane. Moats are formed in the semiconductor body and extend through said surface and have spaced side walls lying in a plane different from the <100> plane and at the surface define spaced islands formed from the semiconductor body. Layers of protective material are formed on the side walls of the moats. Regions of said impurity of one conductivity type and of a greater concentration than that in the semiconductor body extend downwardly into the semiconductor body from the protective layers. An insulating material fills the moats. A protective layer is provided on the surface and devices are formed in the islands. Metallization forming leads is provided on the protective layer and on the material filling the moats and extends through the insulating layer to make contact to the devices and to interconnect the devices in the separate islands. The moats are rectangular and have inner and outer perimeters with inner and outer corners. The outer corners are defined by diagonal, generally planar wall portions which lie in either the <110> or <111> plane. The side walls of the moats, if desired, can extend downwardly until they form a Vee in cross-section.

In general, it is an object of the invention to provide a semiconductor structure and method and on which an adequate protective layer can be formed on the corners of the moats.

Another object of the invention is to provide a semiconductor structure and method of the above character in which the outside corners of the moat are defined by diagonal, substantially planar wall portions which lie in either the <110> or <111> planes.

Another object of the invention is to provide a semiconductor structure and method of the above character in which the moats can be formed by having the side walls extend downwardly until they form a Vee in cross-section.

Additional objects and features of the invention will appear from the following description in which the preferred embodiment is set forth in detail in conjunction with the accompanying drawings.

BRIEF DESCRIPTION OF THE PREFERRED EMBODIMENTS

Figure 1:
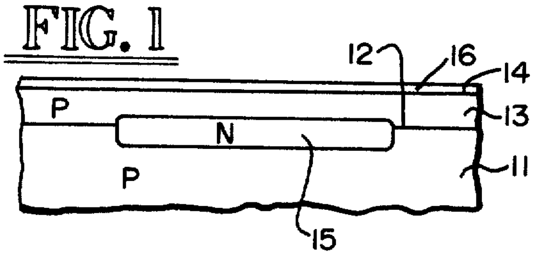
FIG. 1 is a cross-sectional view of a semiconductor body utilized in connection with the semiconductor structure and method incorporating the present invention.

In the fabrication of a semiconductor structure incorporating the present invention, a semiconductor body 11 of a suitable semiconductor material such as silicon is provided which has a major surface 12 lying in the <100> plane. The semiconductor body has an impurity of one conductivity type therein as, for example, P-type. It should be appreciated that this P-type semiconductor body can be utilized directly for the fabrication of the semiconductor structure incorporating the present invention. Alternatively, an epitaxial layer 13 can be formed on the surface 12 and by way of example can be provided with an impurity of opposite or N-conductivity type to form a PN junction at the interface 12 between the semiconductor body 11 and the epitaxial layer 13. The epitaxial layer 13 is also provided with a surface 14 which lies in the <100> plane. A buried layer 15 of N or opposite conductivity type is formed in the body 11 prior to the formation of the epitaxial layer 13 in a manner well known to those skilled in the art.

Figure 2:
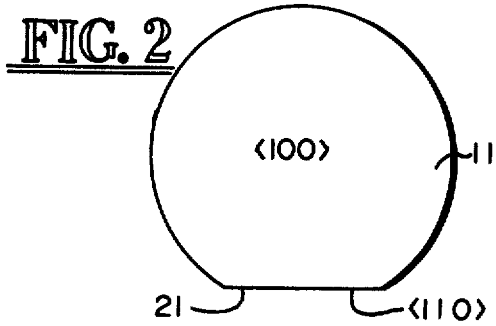
FIG. 2 is a reduced plan view of a semiconductor wafer utilized in the present method showing the orientation of the major surfaces and the flat of the wafer.

A protective layer 16 of a suitable material such as silicon dioxide is provided on the surface 14. The protective layer 16 serves as a mask as hereinafter described. Openings 19 (see FIG. 3) are formed in the protective layer 16. These openings 19 are formed by conventional photolithographic and etching techniques. For example, a mask (not shown) which has the desired pattern thereon is utilized in conjunction with a photoresist layer (not shown) provided on the layer 16 to provide the desired pattern of holes 19. As shown in FIG. 2, the pattern of the holes 19 is oriented in a particular manner on the <100> surface of the semiconductor body 11 which in FIG. 2 has been shown in the form of a wafer. Such wafers, as is well known to those skilled in the art, are conventionally provided with a flat 21 which lies in the <110> plane.

Figure 3:
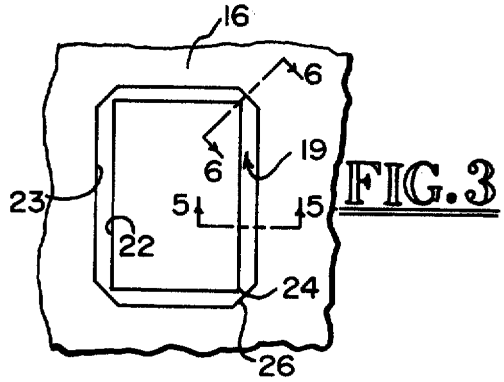
FIG. 3 is an enlarged plan view of the pattern in the protective layer for one of the moats to be formed in the wafer shown in FIG. 2.

The openings 19 in the protective layer 16, as shown in FIG. 3, have a generally rectangular configuration and have inner and outer perimeters 22 and 23 and four inner and outer corners 24 and 26. The inner corners 24 are right-angle corners as shown, whereas the outer corners 26 are provided with a diagonal wall 27 therein which extends across the corner at an angle of 45° with respect to the adjacent sides of the outer perimeter for a purpose hereinafter described.

Figure 4:
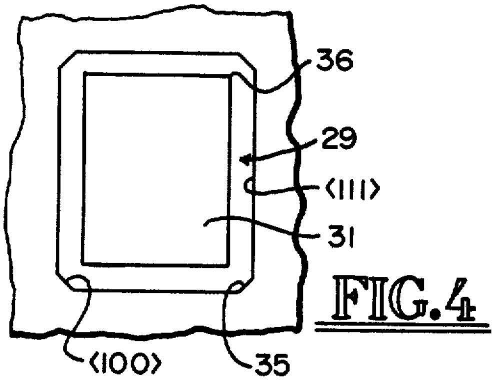
FIG. 4 is an enlarged plan view of one of the moats formed in the wafer with the protective layer removed.
Figure 5:
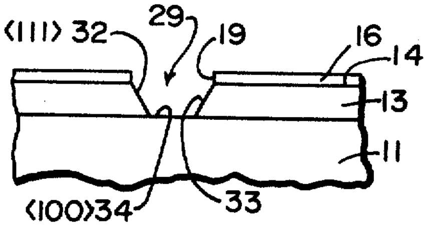
FIG. 5 is an enlarged cross-sectional view taken along the line 5—5 of FIG. 3.

As soon as the openings 19 have been formed in the protective layer 16, an anisotropic etch is utilized to contact the portions of the surface 14 exposed in the openings. Since the major walls defining the openings 19 have been aligned so that they are perpendicular and/or parallel to the <110> flat 21 which means that the major walls defining the openings 19 are parallel with the <111> planes which intersect the <100> surface plane 14 at an angle of 54.74°. Thus, etching will occur along the <111> planes with respect to the side walls defined by the inner and outer perimeters 22 and 23 of the openings 19. Etching with respect to the diagonal side walls 26 will occur along the <110> planes. Etching continues until moats 29 are formed which have a rectangular configuration at the surface 14 of the same type as represented by the pattern 19. The moats 29 extend downwardly into the semiconductor body 11 to form generally rectangular islands 31 with inclined side walls. As shown in FIGS. 4 and 5, the moats 29 can be formed to a depth which extends to or beyond the PN junction 12. However, if desired, the etching can be interrupted so that the bottom wall 34 is spaced slightly above the PN junction 12. As shown in FIG. 5, the moats are defined by inclined side walls 32 and 33 that lie in the <111> planes and which extend at an angle of 54.74° from the horizontal and a bottom wall 34 that lies in the <100> plane parallel to the surface 14.

Figure 6:
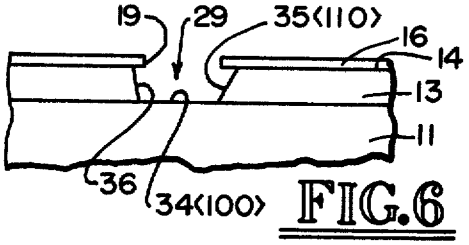
FIG. 6 is an enlarged cross-sectional view taken along the line 6—6 of FIG. 3.
Figure 7:
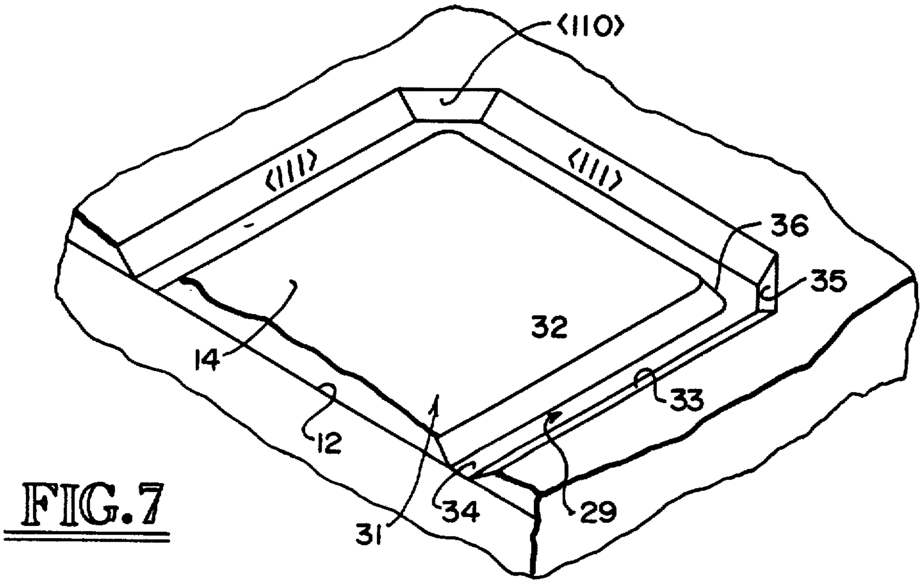
FIG. 7 is an enlarged partial isometric view of the moat shown in FIG. 4 with the protective layer removed.

In each of the outside corners of each of the moats 29 there is formed a diagonal planar wall 35 which lies in the <110> plane that forms an angle 45° from the horizontal (see FIG. 6). Since etching along the <110> planes will be faster than along the <111> planes, the diagonal side walls 35 will have a length which is less than that of the diagonal side walls 26 formed in the protective layer 16. In view of the fact that the etching is on the <110> plane, there is substantial undercutting of the protective silicon dioxide layer 16. The inside corners 36 are generally rounded and expose several planes. As shown in FIG. 6, there will be relatively little undercutting with respect to the inside corners. Since there is some undercutting at the corners, it is generally desirable that the mask be made somewhat smaller than the moats so that the moats will have the desired size. By way of example, the pattern 19 in the mask can have a width as, for example, 5 microns to provide moats which have a width of approximately 8 microns.

Figure 8:
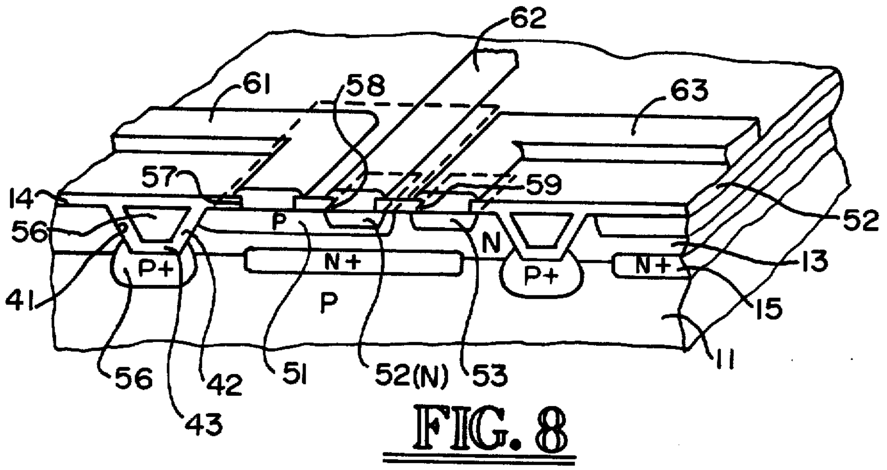
FIG. 8 is a partial isometric plan view, a portion of which is shown in cross-section, of a completed semiconductor structure incorporating the present invention.
Figure 9:
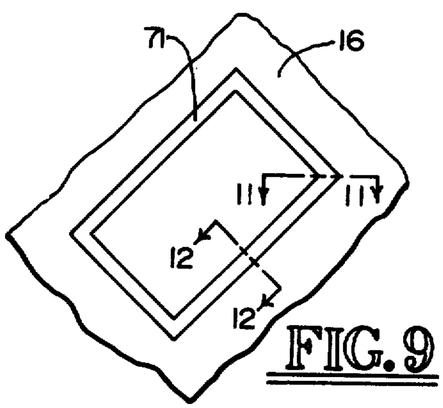
FIG. 9 is an enlarged plan view showing the pattern in the protective layer for one of the moats to be formed in the wafer in which the pattern is oriented at a 45° angle with respect to the wafer flat.
Figure 10:
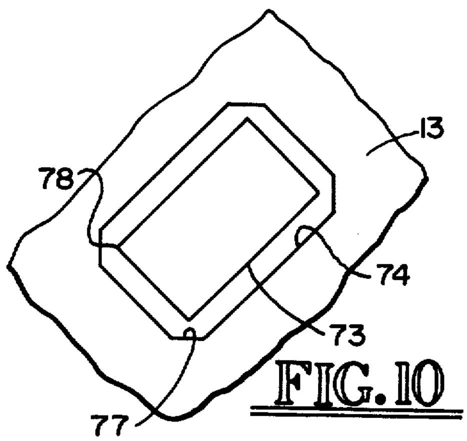
FIG. 10 is an enlarged plan view showing a moat formed in the wafer with the protective layer removed.

Thereafter follows a series of steps which are very similar to that hereinbefore described in copending application Ser. No. 169,294, filed Aug. 5, 1971, now U.S. Pat. No. 3,796,612. As described therein, a protective layer is formed on the exposed portions of the surface 14 and in the moats 29. This is carried out by providing a layer of thermally grown silicon dioxide on the exposed surfaces which can be grown in a manner well known to those skilled in the art. However, it has been found that if the oxidation is carried out at a relatively low temperature as, for example, temperatures on the order of 800° to 900°C, there is a differential growth rate of the silicon dioxide which is less on the surfaces lying in the <100> plane than in the surfaces lying in the other planes namely, the <111> and <110> planes in which the side walls 32 and 33 and the diagonal walls 35 lie. Thus, as shown in FIG. 8, there are provided layers 41 and 42 of silicon dioxide on the side walls which, by way of example, can have a thickness of approximately 3,000 Angstroms and a layer 43 on the bottom wall which can have a thickness of approximately 1,000 Angstroms. In any event, it is desirable to obtain a differential in thickness between the bottom and side walls of approximately 1,000 Angstroms.

After the insulating layers have been formed in the moats 29, the structure is subjected to a dilute etch for a sufficient period of time to permit the removal of the silicon dioxide layer 43 from the bottom walls 34 so that there remains a silicon dioxide layer of sufficient thickness on the side walls of the moat to serve as a protective layer to prevent impurities from penetrating the same through diffusion or ion implantation.

Impurities of the same conductivity type as in the body 11 are then caused to enter through the exposed bottom walls 34 and into the semiconductor body. This can be accomplished in a suitable manner such as a predeposition step involving diffusion or by ion implantation. Thereafter, the impurities are driven deeper into the semiconductor body to provide regions 56 which extend outwardly and downwardly from the bottom of the bottom wall 38 and at least to the PN junction 12. This can be accomplished in a suitable manner such as placing the structure shown in FIG. 6 in a furnace and heating the same at a temperature of 1,050° for a period of approximately 30 minutes. During this driving in step, silicon dioxide layers 43 are again formed on the bottom walls 34 and adjoin the layers 41 and 42 which grow in thickness during the drive-in step. For example, they can reach a thickness of 4,000 Angstroms. With the construction described, there is more than adequate protection provided by the layers of silicon dioxide which are formed on the diagonal walls 35 and on the inside corners 36.

As explained in copending application Ser. No. 169,294, filed Aug. 5, 1971, now U.S. Pat. No. 3,796,612 if desired, the step which is utilized for forming the P+ regions 56 can also be utilized for forming the bases of transistors which are formed in the islands 31. Alternately, if desired, the base and emitter regions 51 and 52 as well as the collector contact regions 53 can be formed separately and independently of the regions 56 by conventional photolithographic and etching techniques in utilizing either diffusion or ion implantation to provide the necessary impurities.

Either prior to or after the formation of the active and passive devices in the islands 31, the moats 29 are filled with a suitable material such as polycrystalline silicon as shown in FIG. 8. Thereafter, openings 57, 58 and 59 are formed in the silicon dioxide layer so that they overlie the regions 51, 52 and 53. Metallization is then formed on the silicon dioxide layer 52 which extends over the surface 14 and over the polycrystalline material 56 in the moats. The undesired metal is removed by conventional photlithographic and etching techniques so that there remain leads 61, 62 and 63 making contact to the regions 51, 52 and 53. As will be noted, these leads 61, 62 and 63 extend across the polycrystalline regions 56 and to the other islands to interconnect the devices in the islands to form the desired integrated circuit.

After the structure shown in FIG. 8 has been completed, the integrated circuits which have been formed therein can be tested and thereafter, the wafer can be separated into the desired parts in a conventional manner. Since the etching has been carried out along the <111> planes for the side walls of the moat, it is possible to merely scribe and break the wafer into the desired parts as with conventional wafers.

The semiconductor structure thus formed can be utilized in a conventional manner. Good isolation is provided between islands by the PN junction 12 in combination with the dielectric isolation formed in the moats and with the regions of higher impurity concentration extending downwardly from the moats and into the semiconductor body. These regions of higher impurity concentration inhibit the formation of inversion layers at the silicon dioxide-silicon interfaces and thus prevent leakage between islands.

Another embodiment of the invention is shown in FIGS. 9–13. As shown therein, the openings 71 formed in the protective layer 16 are oriented so that the major walls forming the outer and inner perimeters of the opening 71 are inclined at an angle of 45° with respect to the <110> flat 21. This means that the openings 71 are aligned so that the major walls defining the opening 71 are parallel to the <110> planes.

Figure 11:
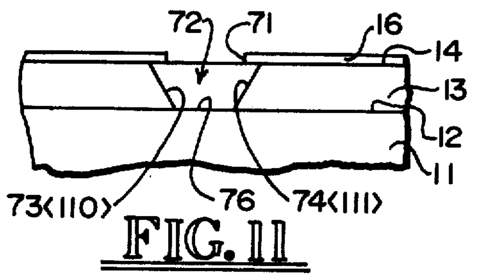
FIG. 11 is an enlarged cross-sectional view taken along the line 11—11 of FIG. 9.
Figure 12:
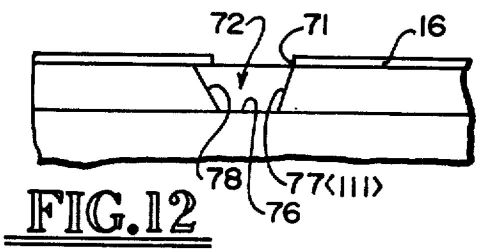
FIG. 12 is an enlarged cross-sectional view taken along the line 12—12 of FIG. 9.
Figure 13:
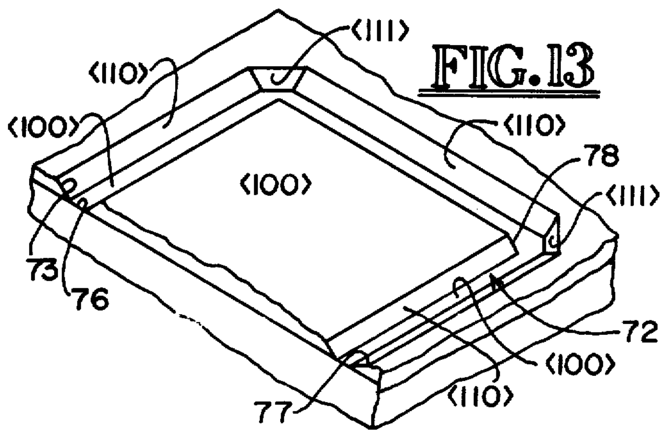
FIG. 13 is an enlarged partial isometric view of the moat shown in FIG. 10 with the protective layer removed.

The openings 71 are formed in the layer 16 in the same manner as the openings 19. It will, however, be noted that the mask 71 is somewhat different than the mask 19 principally in that no diagonal side walls are provided in the mask formed by the protective layer 16. The portions of the surface 14 exposed by the openings 71 are subjected to an anisotropic etch which causes the formation of moats 72. The moats 72 are defined by side walls 73 and 74 and a bottom wall 76. The side walls 73 and 74 extend in at an angle of 45° from the surface, whereas the bottom wall 76 is parallel to the surface 14. Since this etching is along the <110> plane, there is substantial undercutting of the protective layer 16 as shown in FIG. 11. The outside corners of the moat are formed by diagonal side walls 77 which lie in the <111> planes and inside corners 78 are in the form of right angles in plan. The diagonal side walls 77 are formed at the outside corners because the <110> planes intersect at the outside corners at the <111> plane which does not etch nearly as rapidly as the <110> planes. Because of this reason, the <111> plane is exposed as the material is etched away from along the <110> planes to provide the planar diagonal side walls 77 which lie in the <111> planes. Thus, the diagonal side wall is formed as etching is continued and has a length which is a direct function of the time of etch. In both embodiments, it can be seen that a diagonal planar side wall portion is provided in each of the outside corners of the moats which is utilized to define the islands 31 and 79, respectively.

The semiconductor structure, after formation of the island 79, is completed in the same manner as the embodiment shown in FIG. 8. However, after all of the fabrication has been carried out, the separating of the wafer into the plurality of separate chips can be accomplished in a suitable manner such as by etching or sawing. Scribing and breaking of the wafer normally is not satisfactory when the moats have their major surfaces lying in the <110> planes rather than in the <111> planes.

Thus, it can be seen in the first embodiment of the invention, scribing and breaking can be carried out as with the conventional integrated circuits. In the second embodiment, it is necessary to saw or etch the wafer into separate chips or parts. The second embodiment, however, has the advantage in that the inside corners are sharper and that they intersect at two <110> planes rather than having the rounded inside corners of the first embodiment.

Although the present invention has been described in conjunction with bipolar devices, the isolated islands can also be formed for use with MOS technology. In all of the embodiments, improved isolation is obtained while permitting very close spacing between the islands so that an increased packing density is attained with its attendant lower costs of production. The construction disclosed lends itself to higher speed devices. Parasitics are reduced as is leakage between islands.

Figure 14:
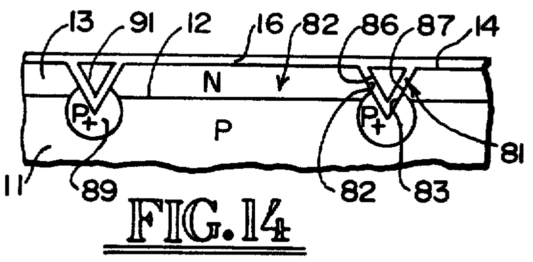
FIG. 14 is a cross-sectional view showing an alternate embodiment of the present invention in which the inclined side walls of the moats extend downwardly to form in cross-section V-shaped moats.

Still another embodiment of the invention is shown in FIG. 14 in which isolation moats 81 are formed to provide isolated islands 82 at the surface 14 by utilizing an anisotropic etch in the manner hereinbefore described to etch along the <110> plane for the side walls 72 and 73 and along the <111> plane for the diagonals as in the previous embodiment. However, in this case, rather than arresting the etching operation before the two side walls 82 and 83 meet to form an apex so that there remains a bottom wall such as bottom wall 34, in the previous embodiment, the etching is permitted to continue until the two side walls 82 and 83 meet so that the moats are triangularly shaped in cross-section as shown in FIG. 8. Protective and insulating layers 86 and 87 formed of silicon dioxide are then thermally grown on the side walls 82 and 83 to a suitable thickness as, for example, 2,200 Angstroms. Thereafter, the structure is subjected to a dilute etch for a suitable period of time so that the layers 86 and 87 are thinned down to approximately 1,000 Angstroms. During the time that this is occurring, it has been found that the portion of the silicon dioxide at the lower extremity of the vee or, in other words, at the apex of the vee, etches at a faster rate for reasons which are unknown to me at the present time. However, it has been found that this etch rate is sufficient so that substantially all of the oxide is removed right at the apex of the vee during the time that the layers on the side walls are being thinned down.

Thereafter, impurities of the desired type can be introduced into the semiconductor body through the bottom of the vee either by a predeposition diffusion step of an ion implantation step. Thereafter, the impurities can be driven to a greater depth into the semiconductor body extending outwardly from the silicon dioxide layers 86 and 87 to provide regions 87 which extend downwardly past the PN junction 12 and which have an impurity concentration which is greater than that of the semiconductor body 11 to serve a purpose as hereinbefore described. During the time that the impurity is being driven downwardly into the semiconductor body, an oxide will again be formed in the apexes of the vee and will adjoin the layers 86 and 87 so that continuous insulating layers are provided in the moats 81.

Thereafter, the moats 81 can be filled with the polycrystalline material 91 as hereinbefore described and active and passive devices can be formed in the islands and interconnected in the manner heretofore described.

Although the method described in conjunction with the semiconductor structure shown in FIG. 14 has been described in conjunction with etching along the <110> planes for the side walls of the moat, it should be appreciated that if it is desired, the <111> planes alternatively can be utilized even though some difficulties may be encountered in connection with the corners as hereinbefore described in conjunction with the previous embodiments.

It is apparent from the foregoing that there has been provided a semiconductor structure and method which makes it possible to obtain improved isolation without sacrificing packing density and without unduly complicating the method or the structure.

I claim:

1. In a method for forming a semiconductor structure, providing a semiconductor body having an impurity of one conductivity type therein and having a major surface lying in a <100> plane, providing an etch resistant mask on said surface and having a predetermined pattern of openings for moats formed therein, bringing an anisotropic etch into contact with the portions of said surfaces lying in the <100> plane exposed by the mask to form moats in the semiconductor body having side walls lying in a plane different from the <100> plane and at said surface defining spaced islands, said side walls defining the moats extending downwardly into the semiconductor body until they join each other to form moats which are substantially V-shaped in cross section, forming protective layers upon said side walls defining the moats, etching away portions of the protective layers in the moats so that the portions of the protective layers at the apex of the moats are removed and the thickness of the protective layers on the side walls is reduced, causing an impurity of said one conductivity type to enter the semiconductor body through the apexes of the moats to form regions of said one impurity of one conductivity type of greater concentration than that of the semiconductor body extending downwardly from the layers of the moats, forming protective layers in the apexes of the moats and adjoining the protective layers on the side walls of the moats, filling the moats with a filling material, forming devices in said islands, providing protective layers overlying said islands and adjoining the protective layers in the moats and forming leads on said layers of protective material extending through said layers of protective material to make contact with said devices in said islands and interconnecting the devices with the devices in other islands.

2. A method as in claim 1 wherein said openings in said mask are formed and positioned so that the moats are formed with a generally rectangular configuration and with inner and outer side walls with inner and outer corners and with a diagonal generally planar wall formed in each of the outer corners.

3. A method as in claim 2 wherein said diagonal wall portions lie in the <110> plane.

4. A method as in claim 2 wherein said diagonal wall portions lie in the <111> plane.

5. A method as in claim 3 wherein the inside corners are rounded.

6. A method as in claim 4 wherein the inside corners are in the form of right angles in plan.

7. In a method for the forming a semiconductor structure, providing a semiconductor body having an impurity of one conductivity type therein and having a major surface lying in the <100> plane, providing an etch resistant mask on said surface and having a predetermined pattern of openings for moats formed therein, utilizing an anisotropic etch to contact the portions of said surface exposed in said openings to form moats in a semiconductor body having a generally rectangular configuration with inner and outer inclined side walls lying in a plane different from the <100> plane and having outside corners with diagonal planar side wall portions formed in the outside corners and forming a layer of insulating material on the side walls and the diagonal planar side wall portions defining the moats, utilizing an etchant to contact the layer of insulating material in the moats to selectively remove the insulating material from the bottoms of the moats while retaining portions of the layer of insulating material on the side walls of the moats, causing an impurity of said one conductivity type to enter the semiconductor body from the bottom of the moats to form regions of said impurity of one conductivity type of greater concentration than that in the body and extending downwardly from the insulating layers on the side walls of the moats, forming insulating material on the bottoms of the moats adjoining the insulating material on the side walls, filling the moats with an insulating material, forming devices in said islands, providing an insulating layer overlying said islands and adjoining the insulating material in the moats and providing means for interconnecting said devices in said islands.

* * * * *